(12) United States Patent
Chen et al.

(10) Patent No.: US 7,407,736 B2
(45) Date of Patent: Aug. 5, 2008

(54) METHODS OF IMPROVING SINGLE LAYER RESIST PATTERNING SCHEME

(75) Inventors: Kuang-Jung J. Chen, Poughkeepsie, NY (US); Wu-Song S. Huang, Poughkeepsie, NY (US); Chung-Hsi J. Wu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 431 days.

(21) Appl. No.: 11/307,289

(22) Filed: Jan. 31, 2006

(65) Prior Publication Data

US 2008/0057443 A1    Mar. 6, 2008

(51) Int. Cl.
    *G03C 5/00* (2006.01)
(52) U.S. Cl. .................. 430/296; 430/328; 430/330; 430/942
(58) Field of Classification Search ................ 430/296, 430/328, 330, 510, 512, 513, 514, 515, 516, 430/942, 945
    See application file for complete search history.

(56) References Cited

U.S. PATENT DOCUMENTS

| 3,745,358 | A |  | 7/1973 | Firtz et al. |
|---|---|---|---|---|
| 3,874,916 | A |  | 4/1975 | Livesay et al. |
| 3,887,811 | A |  | 6/1975 | Livesay |
| 3,922,546 | A |  | 11/1975 | Livesay |
| 3,983,401 | A |  | 9/1976 | Livesay |
| 4,528,452 | A |  | 7/1985 | Livesay |
| 5,003,178 | A |  | 3/1991 | Livesay |
| 6,132,814 | A |  | 10/2000 | Livesay et al. |
| 6,210,856 | B1 | * | 4/2001 | Lin et al. .................. 430/270.1 |
| 6,319,655 | B1 |  | 11/2001 | Wong et al. |
| 6,407,399 | B1 |  | 6/2002 | Livesay |
| 6,489,225 | B1 |  | 12/2002 | Ross et al. |
| 6,607,991 | B1 |  | 8/2003 | Livesay et al. |
| 6,753,129 | B2 |  | 6/2004 | Livesay et al. |
| 6,831,284 | B2 |  | 12/2004 | Demos et al. |
| 6,890,825 | B2 |  | 5/2005 | Ross et al. |
| 6,900,001 | B2 |  | 5/2005 | Livesay et al. |
| 6,939,664 | B2 | * | 9/2005 | Huang et al. .............. 430/270.1 |
| 7,361,444 | B1 | * | 4/2008 | Angelopoulos et al. ..... 430/166 |
| 2001/0016302 | A1 |  | 8/2001 | Hirayanagi et al. |
| 2004/0152024 | A1 |  | 8/2004 | Livesay et al. |

OTHER PUBLICATIONS

Chung-Hsi J. Wu, et al., "Investigation on the Mechanism of the 193nm Resist Linewidth Reduction During the SEM Measurement", Proceedings of SPIE, vol. 4345 (2001).

* cited by examiner

*Primary Examiner*—Christopher G Young
(74) *Attorney, Agent, or Firm*—Joseph Petrokaitis; Hoffman Warnick LL

(57) ABSTRACT

Methods for improving a single layer resist (SLR) patterning scheme, and in particular, its SLR layer and anti-reflective coating (ARC) etch selectivity, are disclosed. In one method, a patterned SLR layer over an anti-reflective coating (ARC) is provided and at least a portion of the patterned SLR layer and a portion of the ARC are exposed to radiation. The radiation may include, for example, an electron beam or an ion beam. The radiation exposure selectively breaks the polymer chains of the ARC and reduces the thickness of the ARC due to the loss of volatile function groups and free volume. As a result, the etch rate of the ARC is increased due to the conversion from polymer to monomer. Therefore, less resist will be consumed during, for example, an ARC open etch.

5 Claims, 5 Drawing Sheets

METHODS OF IMPROVING SINGLE LAYER RESIST PATTERNING SCHEME

BACKGROUND OF THE INVENTION

1. Technical Field

The invention relates generally to semiconductor fabrication, and more particularly, to methods of improving single layer resist (SLR) patterning schemes.

2. Background Art

Conventional semiconductor fabrication uses single layer resist (SLR) patterning schemes for etching underlying layers. Typically, the SLR patterning scheme employs a patterned SLR layer positioned over an anti-reflective coating (ARC), which is opened to expose the underlying layer to be etched. As the semiconductor industry continues to drive toward reduced feature size, however, one of the biggest challenges for SLR patterning schemes is maintaining the resist pattern fidelity throughout the subsequent image transfer procedures, including etching through the ARC layer and the underlying layers. Inadequate resist thickness through the etch process results in degradation or sometimes total loss of the patterned images. In other words, conventional SLR patterning schemes do not present sufficient etch resistance. FIGS. 1-2 show an illustrative etching process in which a patterned SLR 100 is positioned over an ARC layer 102, which is positioned over an underlying layer 104. As an ARC open etch 110 (FIG. 2) proceeds, patterned SLR 100 becomes significantly thinner, which prevents continued use of patterned SLR 100.

One approach to mitigating this issue is to increase the SLR layer thickness and/or decrease the ARC thickness. However, the decision on the optimal operating SLR layer thickness is generally associated with the reflectivity swing curve (i.e., a sinusoidal variation of reflectivity as a function of resist thickness), and the increase in SLR layer thickness often results in process window reduction due to issues like resist line collapse or resist profile degradation. Reducing the operating thickness of each given ARC is also unfavorable due to concerns on the reflectivity control and sometimes on the coverage of topography. Other common manufacturing solutions for the SLR patterning scheme problem include implementing SLR patterning schemes with inorganic hard mask, bi-layer or tri-layer processes. Each of these solutions, however, requires changes to the integration scheme, adding process costs and increasing complexity.

Improving resist etch resistance has been employed, for example, as disclosed in U.S. Pat. No. 6,753,129, issued to Livesay et al. In this disclosure, a photoresist is modified by electron beam exposure. While this technique improves resist etch resistance, it does not address the difficulties presented by an ARC, which is not used in the particular resist scheme of that disclosure.

In view of the foregoing, there is a need in the art for a way to mitigate the etch burden of selective photoresists and therefore extend the application of the single layer resist (SLR) patterning scheme to beyond the current physical limit.

SUMMARY OF THE INVENTION

Methods for improving a single layer resist (SLR) patterning scheme, and in particular, its SLR layer and anti-reflective coating (ARC) etch selectivity, are disclosed. In one method, a patterned SLR layer over an anti-reflective coating (ARC) is provided and then at least a portion of the patterned SLR layer and a portion of the ARC are exposed to radiation. The radiation may include, for example, an electron beam or an ion beam. The radiation exposure selectively breaks the polymer chains of the ARC and reduces the thickness of ARC due to the loss of volatile function groups and free volume. As a result, the etch rate of the ARC is increased due to the conversion from polymer to monomer. Therefore, less resist will be consumed during, for example, an ARC open etch.

A first aspect of the invention provides a method for a single layer resist (SLR) patterning scheme, the method comprising the steps of:
providing a patterned SLR layer over an anti-reflective coating (ARC), the patterned SLR layer and the ARC each including a polymer; and
exposing at least a portion of the patterned SLR layer and a portion of the ARC to radiation.

A second aspect of the invention provides a method for a single layer resist (SLR) patterning scheme, the method comprising the steps of: providing a patterned SLR layer over an anti-reflective coating (ARC), the patterned SLR layer and the ARC each including a polymer; and exposing at least a portion of the patterned SLR layer and a portion of the ARC to radiation to cause side chain scission in the patterned SLR layer and the ARC.

A third aspect of the invention provides a method for a single layer resist (SLR) patterning scheme, the method comprising the steps of: providing a patterned SLR layer over an anti-reflective coating (ARC), the patterned SLR layer and the ARC each including a polymer; heating the patterned SLR layer and the ARC; and exposing at least a portion of the patterned SLR layer and a portion of the ARC to radiation to cause side chain scission in the patterned SLR layer and the ARC.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
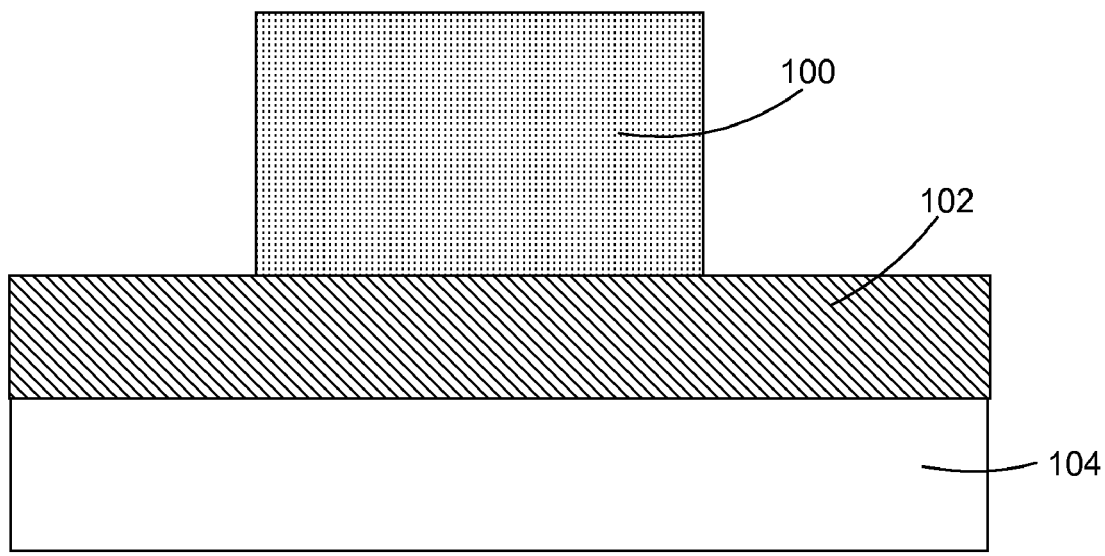
FIGS. 1-2 show an etch process using a conventional SLR patterning scheme.
Figure 2:
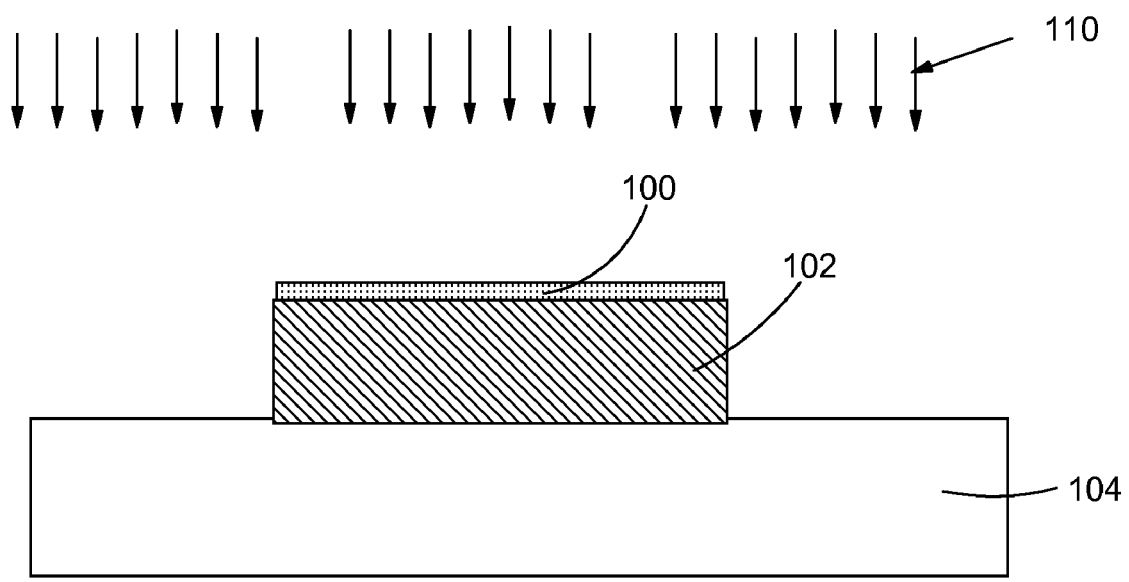
Figure 3:
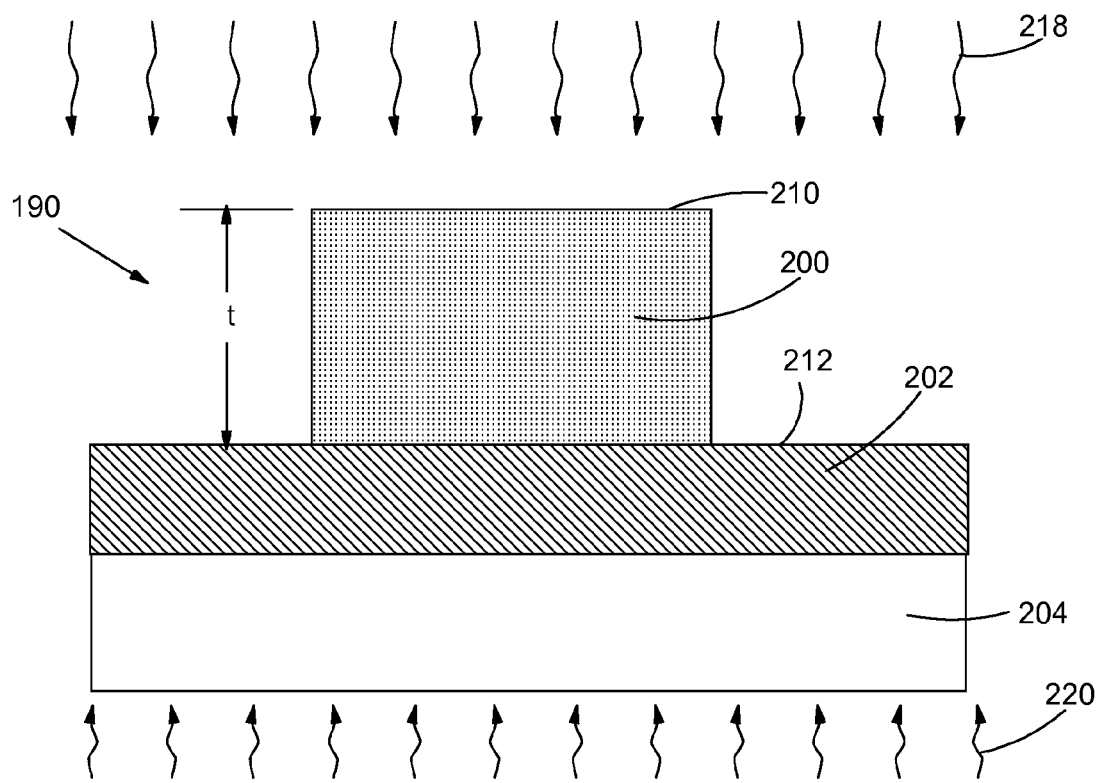
FIGS. 3 and 4 show methods of improving an SLR patterning scheme according to the invention.
Figure 4:
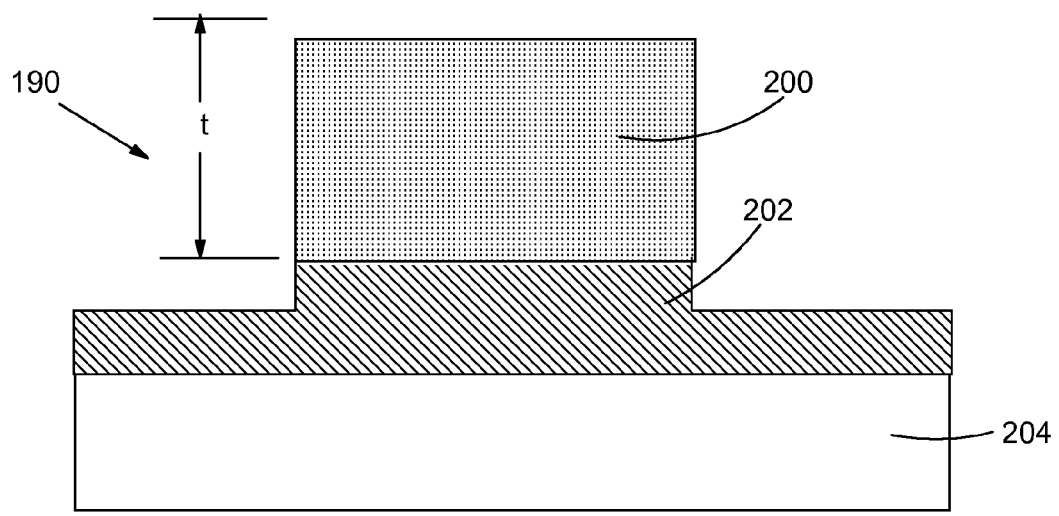

Turning to the drawings, FIGS. 3 and 4 show methods of improving an SLR patterning scheme according to the invention. In particular, the methods improve etch selectivity of a single layer resist (SLR) patterning scheme by increasing etch selectivity between a patterned SLR layer and an associated anti-reflective coating (ARC). The methods begin with provision of a preliminary structure 190, shown in FIG. 3, including a patterned SLR layer 200 over an anti-reflective coating (ARC) 202. ARC 202 is positioned over an underlying layer 204, e.g., a silicon substrate, to be patterned using SLR layer 200 and ARC 202. Patterned SLR layer 200 and ARC 202 may be formed via any now known or later developed process. Patterned SLR layer 200 has an initial thickness (t).

According to the invention, patterned SLR layer 200 and ARC 202 each include a polymer (not necessarily the same polymer), and patterned SLR layer 200 is sensitive to 193 nm, 157 nm and/or extreme ultraviolet (EUV) light. In particular, in one embodiment, patterned SLR layer 200 may include a poly-methacrylate based polymer, a poly-cycloolefin based polymer, a vinylether-maleic anhydride or a cycloolefin-maleic anhydride based polymer. For example, patterned SLR layer 200 may include model PAR-710 resist, available from Sumitomo®, or COBRA-3000, available from JSR Micro®. Also, in one embodiment, ARC 202 may include an aromatic poly-methacrylate based polymer, a poly-ester based polymer or a poly-sulfone based polymer. For example, ARC 202 may include model AR19, available from Shipley®.

FIG. 3 also shows the step of exposing at least a portion 210 of patterned SLR layer 200 and, in particular, a portion 212 of ARC 202 to radiation 218 according to the invention. Radiation 218 may include energy from, for example, an electron beam or an ion beam. In one embodiment, portion(s) 210, 212 of patterned SLR layer 200 and ARC 204, respectively, are exposed to a scanning electron microscope (SEM). However, the same effect can be achieved by use of an exposure tool such as any one of: a flood electron beam exposure tool, an electron beam direct writing tool and a flood ion beam exposure tool.

Figure 5:
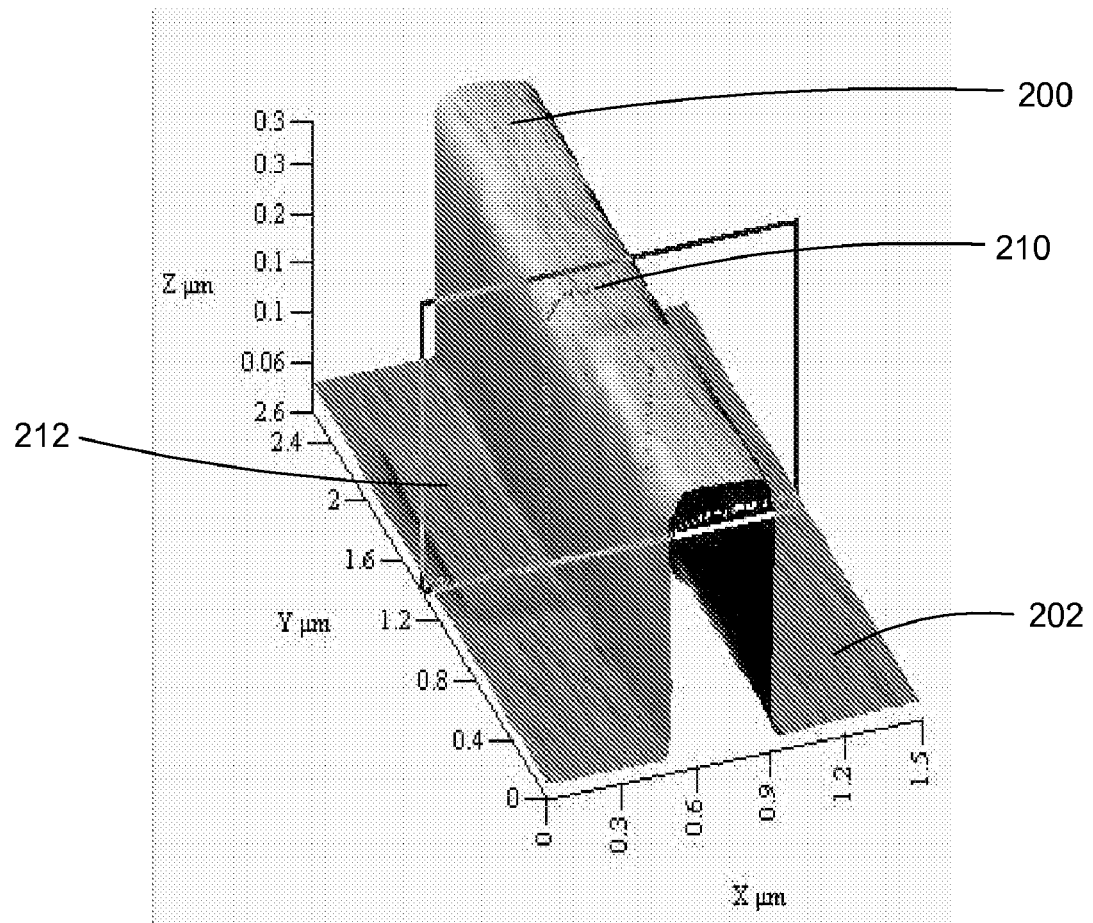
FIG. 5 shows an atomic force microscope (AFM) analysis of a patterned SLR layer and ARC.

As shown in FIGS. 4 and 5, the exposing step acts to "shrink" both patterned SLR layer 200 and ARC 202 in portions 210, 212. Note the thickness of patterned SLR layer 200 and ARC 204 is decreased in FIGS. 4 and 5. FIG. 5 shows an atomic force microscope (AFM) analysis of a patterned SLR layer 200 and ARC 202. In FIG. 5, portions 210 and 212 have been exposed to an SEM, resulting in shrinkage in those portions. In particular, the exposing step causes side chain scission in patterned SLR layer 200 and ARC 202. In one illustrative situation, where pattern SLR layer 200 includes a poly-cycloolefin based polymer (e.g., COBRA-3000) and ARC 202 includes an aromatic poly methacrylate combination (e.g., AR19), both polymer platforms undergo side chain scission upon the initial exposure to radiation 218 (FIG. 3). The extent of shrinkage from radiation exposure, and in particular, e-beam exposure, depends on the free volume and rigidity (Tg) of the original polymer matrix, as well as the size and volatility of the side chain fragments.

Figure 6:
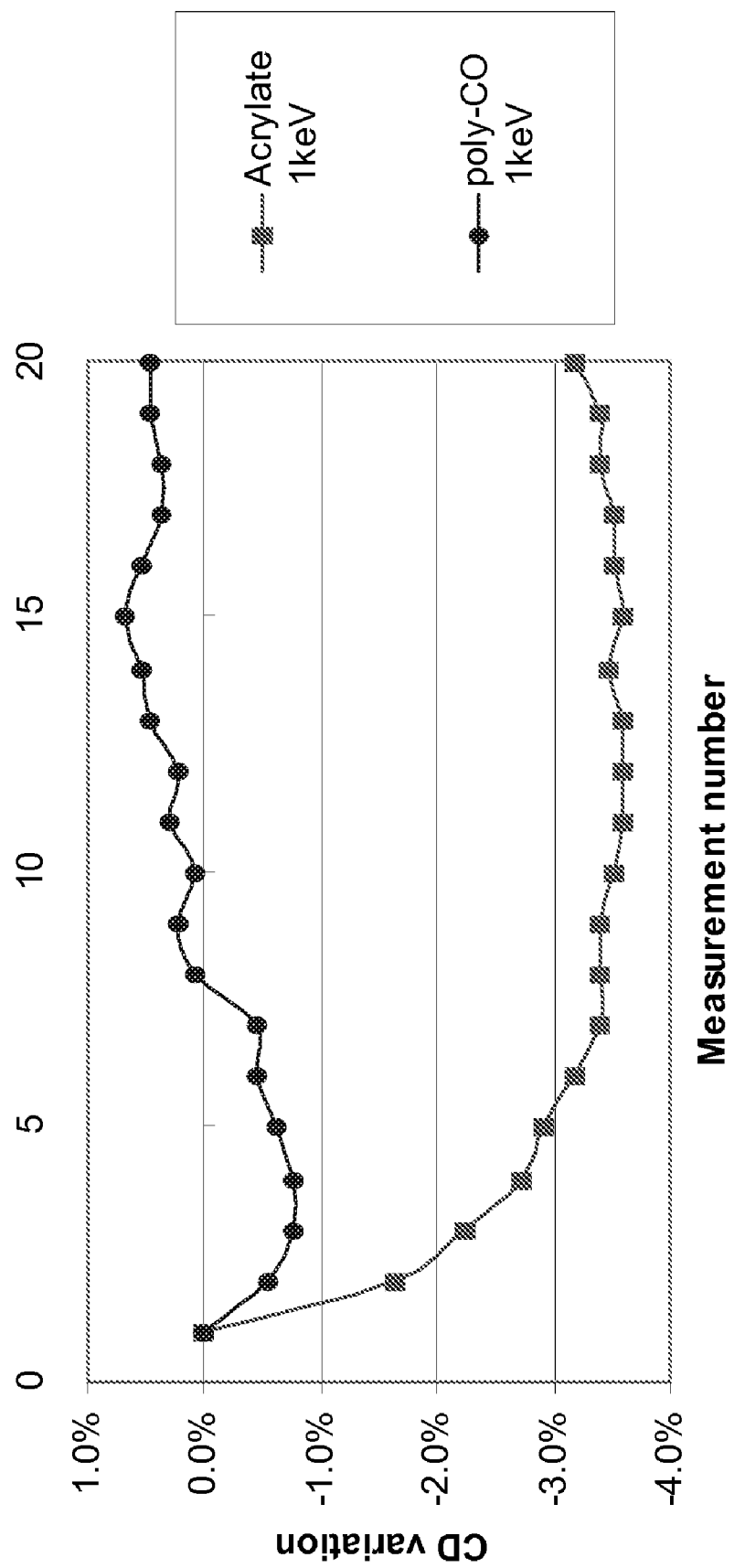
FIG. 6 shows a graph illustrating shrinkage rates of different SLR layer materials.

FIG. 4 shows that while patterned SLR layer 200 shrinks, ARC 202 shrinks at a much greater scale. For example, for a patterned SLR layer 200 of approximately 360 nm, shrinkage may account for approximately 9 nm or 2.5% of total thickness. In contrast, for an ARC 202 of approximately 80 nm, shrinkage may account for approximately 16 nm, or 20% of total thickness. The amount of shrinkage is also strongly dependent on the material used for patterned SLR layer 200. For example, FIG. 6 shows a graph illustrating shrinkage dependency of a patterned SLR layer 200 critical dimension (CD) in two different polymer platforms versus different measurements during exposure to: a 1 keV of SEM radiation, a probe current setting at approximately 10 pA and a field of view of 1 square μm. A poly-methacrylate resist (e.g., PAR-710) shows slimming that levels off at around 3.5% of CD, while the poly-cycloolefin based polymer resist (e.g., model COBRA-3000, available from JSR Micro®) shows less than 1% of CD slimming throughout the entire measurement cycle, e.g., of about 2 seconds.

In the case of a poly-methacrylate platform for patterned SLR layer 200, the radicals generated from the side chain scission may further induce main chain scission, leading to a collapse of the polymer platform and render a faster consumption rate under etch. This has been observed in an SEM environment where local heating is known to act as a catalyst for main chain scission. Therefore, in one alternative embodiment, as shown in FIG. 3, the exposing step may also include heating 220, e.g., on a hot plate, of patterned SLR layer 200 and ARC 202 during or prior to the exposure 218. In the case of a poly-cycloolefin based polymer or a cycloolefin-maleic anhydride based polymer is used for patterned SLR layer 200, the polymer main chains are more stable and hence the slimming is limited to the volatility of the side chain fragments. As a result, less radiation induced shrinkage on these two types of platforms is expected, and also less impact on the etch rate compared to the methacrylate polymers.

Controlling of the exposure is also advantageous to control, among other things, shrinkage. For example, when an SEM is used, the exposing step may include controlling the radiation exposure to induce shrinkage of a thickness (t) of portion 210 of patterned SLR layer 200, and a thickness of portion 212 of ARC 202. In addition, as discussed above, the exposure may also be controlled to induce destruction of a main polymer chain of ARC 204. Furthermore, as discussed above, the exposure may also be controlled to preferably not induce destruction of a polymer platform of patterned SLR layer 200, i.e., the polymer platform is substantially retained. This is in contrast to U.S. Pat. No. 6,753,129 in which an etch resistance increase requires destruction of the polymer platform of the resist. The control implemented will depend on the type of radiation used. For example, the exposure step may include controlling a setting of a landing voltage for an SEM, a current for E-beam and ion beam exposure tools, a scanning time and a field of view of an SEM or an E-beam direct writing tool. Similar controls may be applied where other exposure tools are used, e.g., relative to an ion implanter.

Figure 7:
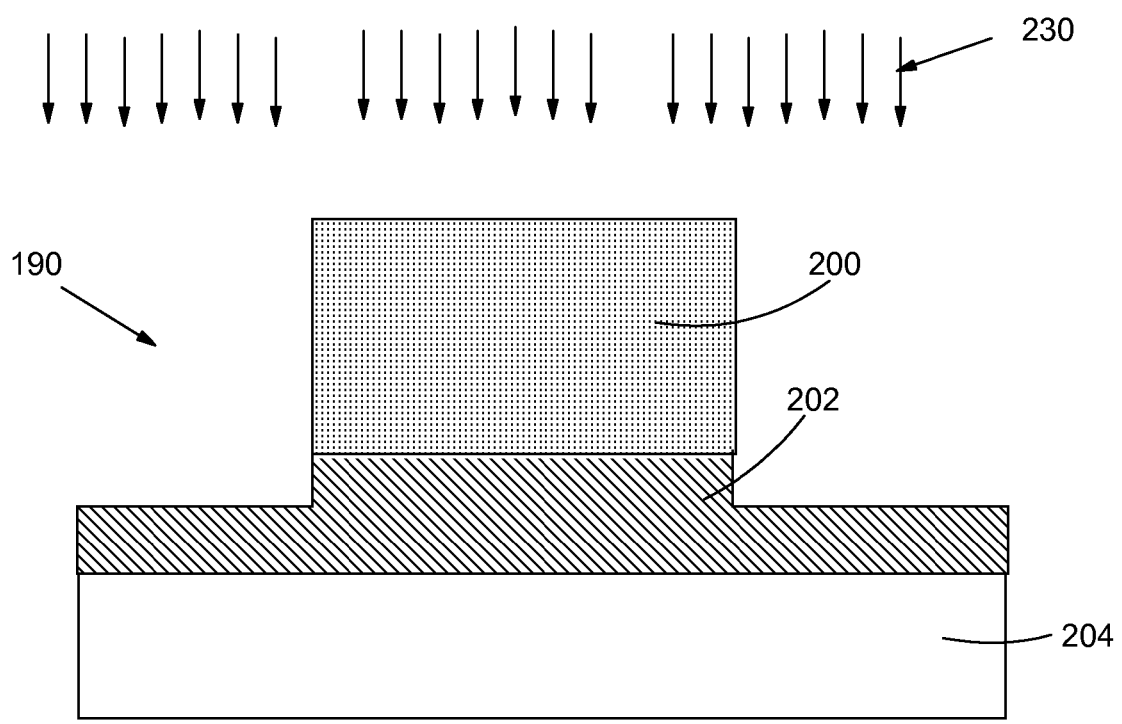
FIG. 7 shows an ARC open etch of the improved SLR patterning scheme of FIG. 4.

FIG. 7 shows a subsequent ARC 202 open etch 230 using, for example, fluorine/oxygen based etch chemistry. During the etch 230, not only will the etch begin with thinner ARC 202 thickness, but also the structurally destructed ARC 202 will etch faster than the regular ARC that was thermally cross-linked prior to the resist coating.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

The invention claimed is:

1. A method for a single layer resist (SLR) patterning scheme, the method comprising:

providing a patterned SLR layer over an anti-reflective coating (ARC), the patterned SLR layer and the ARC each including a polymer, wherein the patterned SLR layer includes one of: a poly-methacrylate based polymer, a poly-cycloolefin based polymer, a vinylether-maleic anhydride and a cycloolefin-maleic anhydride based polymer, and the ARC includes one of: an aromatic poly-methacrylate based polymer, a poly-ester based polymer and a poly-sulfone based polymer; and exposing at least a portion of the patterned SLR layer and a portion of the ARC to radiation, wherein the exposing includes exposing the at least a portion of the patterned SLR layer and the portion of the ARC to an exposure tool selected from one of: a scanning electron microscope (SEM), a flood electron beam exposure tool, an electron beam direct writing tool and a flood ion beam exposure tool, and wherein the exposing includes controlling the radiation exposure to induce: a) shrinkage of a thickness of the at least a portion of the patterned SLR layer and the portion of the ARC, b) substantial destruction of a main polymer chain of the portion of the ARC, and c) substantial retention of a polymer platform of the at least a portion of the patterned SLR layer.

2. The method of claim 1, wherein the radiation includes at least one of the following: an electron beam and an ion beam.

3. The method of claim 1, wherein the patterned SLR layer is sensitive to at least one of: 193 nm, 157 nm and extreme ultraviolet (EUV) light.

4. The method of claim 1, wherein the exposing includes controlling a setting of the exposure tool.

5. The method of claim 1, wherein the exposing includes heating the patterned SLR layer and the ARC during the exposing.

* * * * *